United States Patent [19]

Parrish

[11] Patent Number: 4,479,139
[45] Date of Patent: Oct. 23, 1984

[54] CHARGE COUPLED DEVICE OPEN CIRCUIT IMAGE DETECTOR

[75] Inventor: William J. Parrish, Santa Barbara, Calif.

[73] Assignee: Santa Barbara Research Center, Goleta, Calif.

[21] Appl. No.: 459,281

[22] Filed: Jan. 19, 1983

Related U.S. Application Data

[63] Continuation of Ser. No. 205,544, Nov. 10, 1980, abandoned.

[51] Int. Cl.³ .................... H01L 29/78; H01L 27/14; H01L 31/00; H03K 3/42
[52] U.S. Cl. ...................................... 357/24; 357/30; 307/311
[58] Field of Search .............. 357/24 LR, 30; 307/311

[56] References Cited

U.S. PATENT DOCUMENTS

| | | | |
|---|---|---|---|
| 3,808,435 | 4/1974 | Bate et al. | 357/24 LR |
| 3,944,849 | 3/1976 | Tasch et al. | 357/24 LR |
| 4,143,389 | 3/1979 | Koike et al. | 357/24 LR |
| 4,169,273 | 9/1979 | Hendrickson | 357/24 LR |
| 4,197,469 | 4/1980 | Cheung | 357/24 LR |

Primary Examiner—Gene M. Munson
Attorney, Agent, or Firm—J. Dennis Moore; Mark J. Meltzer; A. W. Karambelas

[57] ABSTRACT

An open circuit photodiode includes a capacitor plate formed monolithically with a forward biased P-N junction diode. The capacitor plate, together with one side of the P-N junction, forms a capacitor which is charged by the photocurrent of the diode. The voltage across the capacitor controls the output current of a charge coupled device (CCD) register. The invention operates in an open circuit configuration so that no net current flows across the diode junction as long as the flux of incident radiation is constant. If the incident radiation flux changes, current flows across the diode junction so that the capacitor is charged (or discharged) to a new voltage level corresponding to the new radiation flux level. As a result, the open circuit voltage of the capacitor modulates as a function of the change in incident radiation flux. The non-linearity inherent in the open circuit voltage response of the diode to incident radiation flux compensates for the nonlinearity in the output current response of the CCD register so that the total response is linear.

5 Claims, 27 Drawing Figures

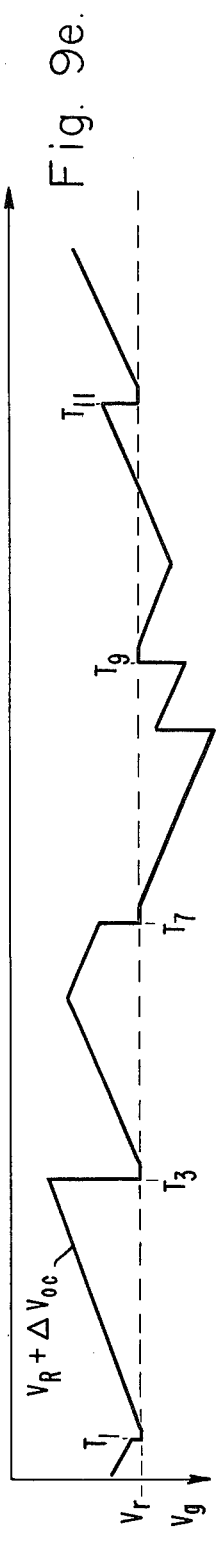
Fig. 9e.
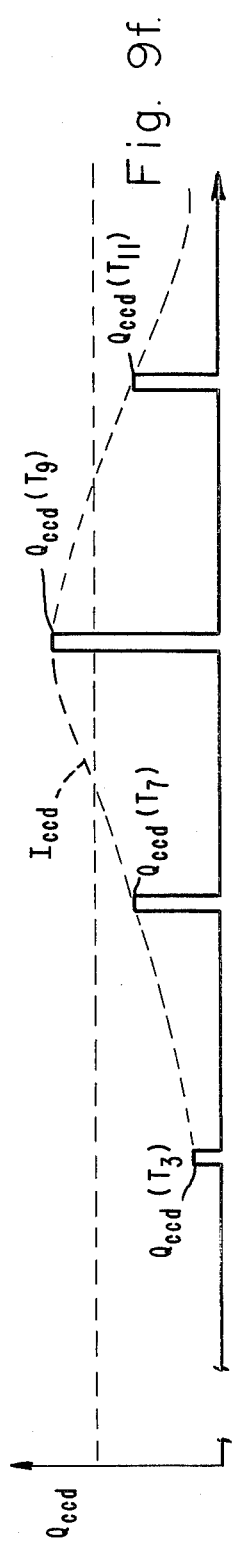
Fig. 9f.
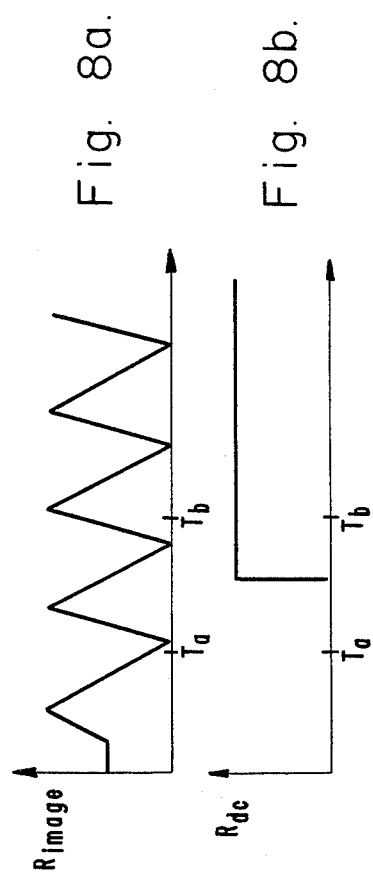
Fig. 8a.
Fig. 8b.

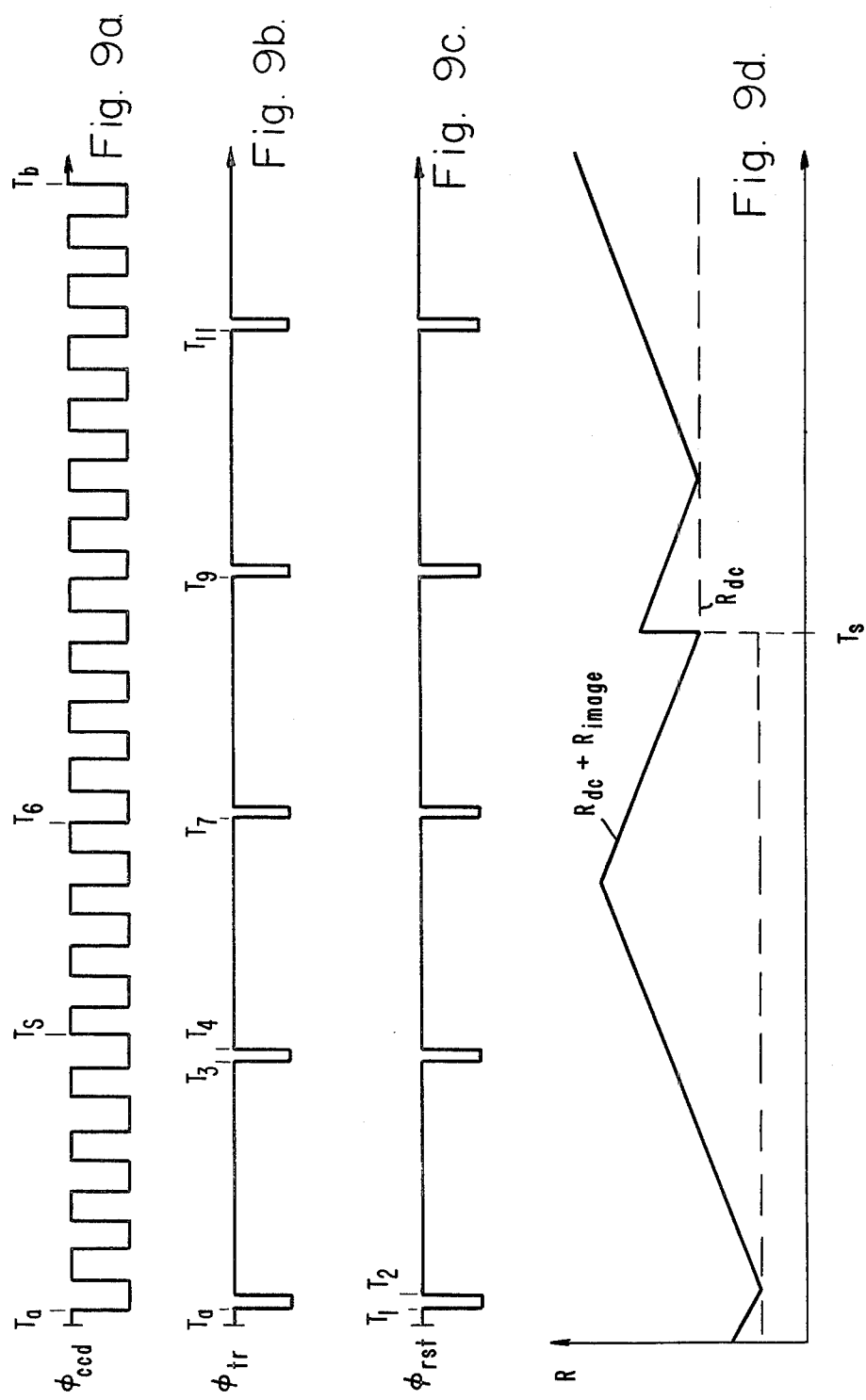

CHARGE COUPLED DEVICE OPEN CIRCUIT IMAGE DETECTOR

This is a continuation of application Ser. No. 205,544, filed Nov. 10, 1980, now abandoned.

TECHNICAL FIELD

This invention is useful in charge coupled device (CCD) infrared imaging devices in which constant background radiation is filtered out of the video signal to enhance dynamic range.

BACKGROUND OF THE INVENTION

Prior art solid state image detectors include a photosensitive diode which is reverse biased to generate a current creating a voltage drop across a resistive load such as a metal oxide semiconductor field effect transistor (MOSFET) in response to radiation incident upon the detector. A disadvantage is that when such a detector and resistive load device are used to control charge injection to a charge coupled device in a focal plane array, the MOSFET serving as the load device for the photodiode takes up a significant amount of space on the semiconductive substrate supporting the detector and the charge coupled device, thus limiting the device density on the substrate.

One problem in focal plane array imagers is that a scene to be viewed by the imager contains both radiation defining the image to be viewed and background radiation which contains no desirable information. If the background radiation is of sufficient intensity, the imager may be saturated, requiring adjustments to the imager which severely limits its dynamic range. In order to avoid this difficulty, the prior art required that an additional device, namely a coupling capacitor, be formed on the semiconductive substrate, to filter out the constant background signal, further limiting the available space on the substrate and decreasing the device density.

SUMMARY OF THE INVENTION

The novel open voltage photodiode of this invention includes a capacitor plate formed monolithically with a P-N junction diode. The capacitor plate, together with one side of the P-N junction, forms a capacitor which is charged by the photocurrent of the diode. The voltage across the capacitor controls the output current of a charge coupled device (CCD) register. Unlike the devices of the prior art, the photodetector diode of the present invention operates in an open circuit configuration so that no net current flows across the diode junction as long as the flux of incident radiation is constant. Initially, radiation incident upon the diode does generate a current flow across the diode junction which charges the capacitor to an open circuit voltage proportional to the flux of the incident radiation. However, as soon as the capacitor is charged to the voltage level corresponding to the incident radiation flux, current flow across the diode junction ceases and no current flows unless the radiation flux changes. If the radiation flux changes to a new flux level, current again flows across the diode junction to change the amount of charge stored on the capacitor so that the capacitor is charged (or discharged) to a new voltage level corresponding to the new radiation flux level. As soon as the capacitor voltage attains the new level, current flow across the diode junction again ceases. The direction of current flow depends upon whether the capacitor is to be charged or discharged, corresponding to an increase or a decrease in radiation flux, respectively. Thus, the open circuit voltage of the capacitor modulates as a function of the change in incident radiation flux.

It is an unexpected result of this invention that the nonlinearity inherent in the open circuit voltage response of the diode to incident radiation compensates for the nonlinearity in the output current response of the CCD register. As a result, the output current of the CCD register is a linear function of the incident radiation flux. Specifically, when the open circuit photodiode capacitor of the present invention is connected to the charge injection input gate of the CCD register in the usual manner of CCD gate modulation, the nonlinearity of the diode open circuit voltage as a function of incident radiation flux compensates for the nonlinear response of the CCD output current to the input gate voltage.

In another aspect of the invention, the usual gate modulation technique of the prior art is replaced by the use of the photodiode capacitor of the present invention in a novel AC coupled direct injection device. Specifically, the open circuit photodiode capacitor of this invention controls the current in a CCD register by accepting a charge packet of predetermined size from the CCD register, the charge packet being stored on the photodiode capacitor during an integration period when radiation is incident on the photodiode. At the end of the integration period, a charge packet of different size is returned to the CCD register. The change in the size of the charge packet is proportional to the change in radiation flux during the integration period and therefore is representative of a video signal generated by the photodiode. The advantage of this direct injection device is that it is inherently insensitive to background radiation or radiation having a constant flux.

BRIEF DESCRIPTION OF THE DRAWINGS

The invention is best understood by reference to the accompanying drawings of which:

FIG. 2b is a simplified diagram of the electrical semiconductor surface potential $S_1$ corresponding to the substrate illustrated in FIG. 2a;

FIG. 7b is a simplified diagram of the electrical semiconductor surface potential $S_2$ corresponding to the diagram of FIG. 7a;

FIG. 8a is an exemplary diagram of the time domain waveform of the photon flux $R_{image}$ of the image radiation incident upon a photodetector, which is illustrated as a saw tooth waveform for the sake of tutorial example only;

FIG. 8b is an exemplary diagram of the time domain waveform of the photon flux $R_{dc}$ of the background radiation incident upon a photodetector, which is illustrated as a step function for the sake of tutorial example only;

FIG. 9a is a diagram of the time domain waveform of the clock signal $\phi_{ccd}$;

FIG. 9b is a diagram of the time domain waveform of the clock signal $\phi_{tr}$;

FIG. 9c is a diagram of the time domain waveform of the clock signal $\phi_{rst}$;

FIG. 9d is a diagram of the time domain waveform of the total radiation flux $R_{image}+R_{dc}$ incident upon a photodetector corresponding to FIGS. 8a and 8b;

FIG. 9e is a diagram of the time domain waveform of the voltage $V_g$ of the input gate of the device of FIG. 2a;

FIG. 9f is a diagram of the time domain waveform of the injected charge $Q_{ccd}$ and the output current $I_{ccd}$ of the CCD register of FIG. 2a;

FIG. 10a is a diagram of the time domain waveform of the clock signal $\phi'_{ccd}$ applied to the device of FIG. 7a;

FIG. 10d is a diagram of the time domain waveform of the total radiation flux $R_{image}+R_{dc}$ from FIGS. 8a and 8b respectively incident upon the photodetector of FIG. 7a;

FIG. 11c is a diagram of the time domain waveform of the charge $Q_{ccd}$ injected into the CCD register of FIG. 7a.

DETAILED DESCRIPTION OF THE INVENTION

Figure 1A:
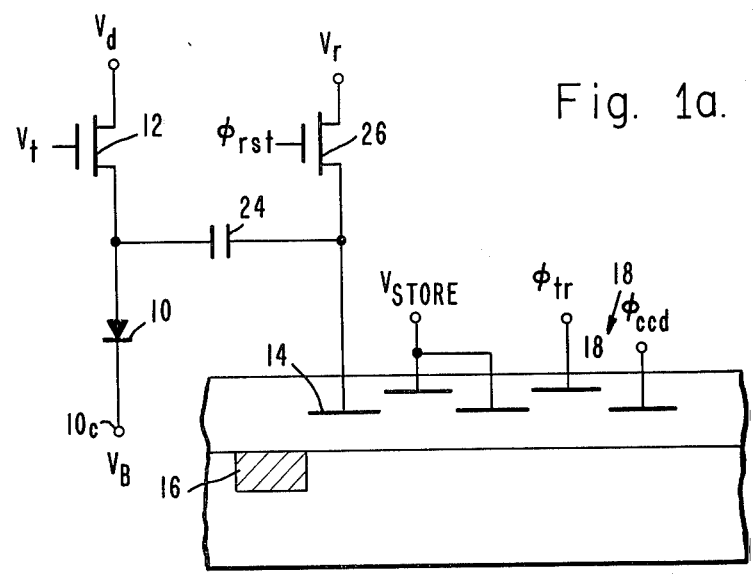
FIG. 1a is a schematic diagram of a charge coupled device imager of the prior art.
Figure 1B:
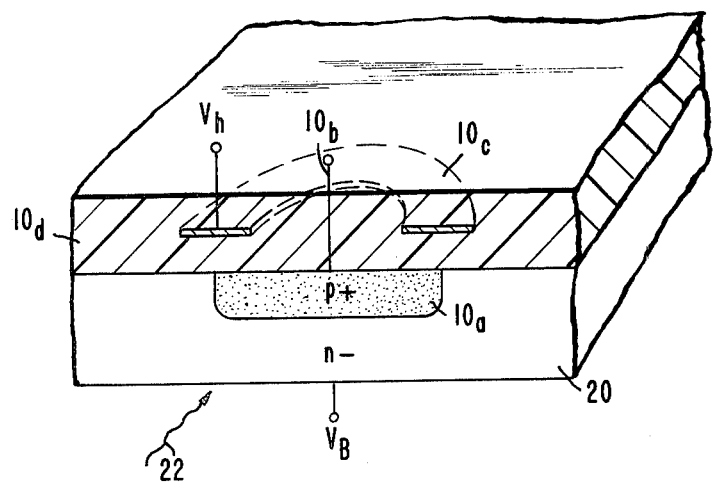
FIG. 1b is a simplified perspective view partially in phantom line of a photodiode of the prior art.

Referring to the schematic diagram of FIG. 1a, prior art infrared imagers typically include a photo-sensitive diode 10 which generates a photocurrent creating a voltage drop across a resistive load device such as a metal oxide semiconductor field effect transistor (MOSFET) 12, the voltage drop determining the voltage on a control gate 14 which regulates the injection of charge from an input diffusion 16 into a CCD register 18. Control of charge injection into a CCD in this manner is known as CCD gate modulation and is fully described in Sequin et al, *Charge Transfer Devices*, Academic Press, New York (1975), pps. 48–52, the disclosure which is hereby incorporated by reference. FIG. 1b is a simplified perspective view of the prior art photodiode 10 which includes a diffusion 10a of P-type conductivity in the top surface of a semiconductive layer 20 of N-type conductivity, an electrical contact 10b to the P-type diffusion 10a and a bias electrode 10c insulated by a dielectric layer 10d.

Figure 3:
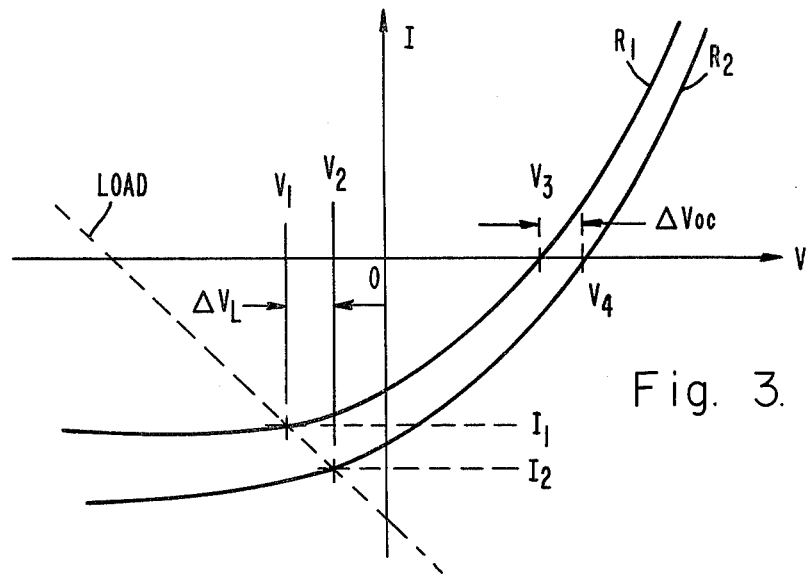
FIG. 3 illustrates the current as a function of junction voltage across a P-N junction of a photosensitive diode in the presence of radiation.

The solid line curves of FIG. 3 are exemplary plots of the photocurrent across a P-N junction, such as that of the diode 10, as a function of the junction voltage for two different radiation fluxes, $R_1$, $R_2$, of radiation 22 incident on the P-N junction. The voltages $V_t$ and $V_d$ applied to the gate and drain of the MOSFET 12 respectively are selected so that its source-to-drain resistance corresponds to the straight dashed line labeled "load" in FIG. 3. The diode 10 generates photocurrents $I_1$, $I_2$ through the MOSFET 12 under the influence of the radiation fluxes $R_1$ and $R_2$ respectively. Therefore, the junction voltage of the diode varies between $V_1$ and $V_2$ in the diagram of FIG. 3 as the radiation flux varies between $R_1$ and $R_2$, respectively.

FIG. 3 shows that the photodiode 10 is at least slightly reverse biased in accordance with the prior art so that its junction voltage lies in the reverse bias region of FIG. 3 between the voltages $V_1$ and $V_2$. This follows the early prior art exemplified in Skvarna, et al, "Current Mode Amplification of Signal and Noise Currents Generated by Indium Antinomide Photovoltaic Infrared Detectors," *IRIS Specialty Group on Detectors and Image Forming Sensors, Joint Meeting*, Santa Barbara, CA, June 15–16, 1964, pps. 1 and 10, and also follows the current practise in the art discussed in Yariv, *Introduction to Optical Electronics*, Holt, Rinehart and Winston, Inc., New York, (1971) p. 292, FIGS. 11–13.

One problem with the device of FIG. 1 is that the nonlinear response of the output current $I_{ccd}$ of the CCD register 18 as a function of the voltage $V_g$ applied to its control gate 14 distorts the output video signal.

Another problem with the prior art device of FIG. 1a is that an external coupling capacitor 24 must be interposed between the photodiode output 10b and the CCD control gate 14 in order to filter out the constant DC output generated by background radiation in order to prevent saturation of the detector by excessive background radiation or a reduction in dynamic range of the detector. Typically, the radiation 22 incident on the photodiode 10 includes both an image from which a video signal is to be generated and background radiation which contains no information. It is desirable to create a video signal from an image in the presence of either a light or a dark background, which can only be accomplished within the limited dynamic range of the CCD register 18 by filtering out background radiation from the video signal. The background radiation typically has a constant flux which generates a constant or a DC component in the output photocurrent of the photodiode 10. In order to render the voltage on the CCD input gate 14 independent of the DC component of the diode output current, the potential on one plate of the external capacitor 24 is reset to a voltage $V_r$ at the end of each CCD clock period under the control of a reset switch 26 gated by a clock signal $\phi_{rst}$. A significant disadvantage of this arrangement is that the capacitor 24 takes up a significant amount of space, thus reducing the device density on the semiconductor layer 20.

Another problem of the device of FIG. 1b is that surface defects between the substrate 20 and the overlying insulating layer 10d may permit carrier leakage across the photodiode junction formed between the diode diffusion 10a and the semiconductor layer 20, uncontrollably changing the electrical characteristics of the diode 10. In order to avoid this problem, the bias electrode 10c overlies the junction between the diode diffusion 10a and the semiconductor layer 20 and has an applied voltage $V_h$ which depletes surface charge carriers from the region of the diode junction to prevent leakage across the junction.

In summary, the load MOSFET 12, the coupling capacitor 24 and the bias electrode 10c take up significant amounts of space on the underlying semiconductor layer, thus limiting the density of the device.

It has been a desirable goal in the art to provide an imager in which the necessity for a resistive load device such as the MOSFET 12, for the external coupling capacitor 24 and for the bias gate 10c is eliminated and in which the nonlinearity of the output current $I_{ccd}$ as a function of the input gate voltage $V_g$ of the CCD register 18 is fully compensated to provide a linear output current as a function of incident radiation flux.

Figure 2A:
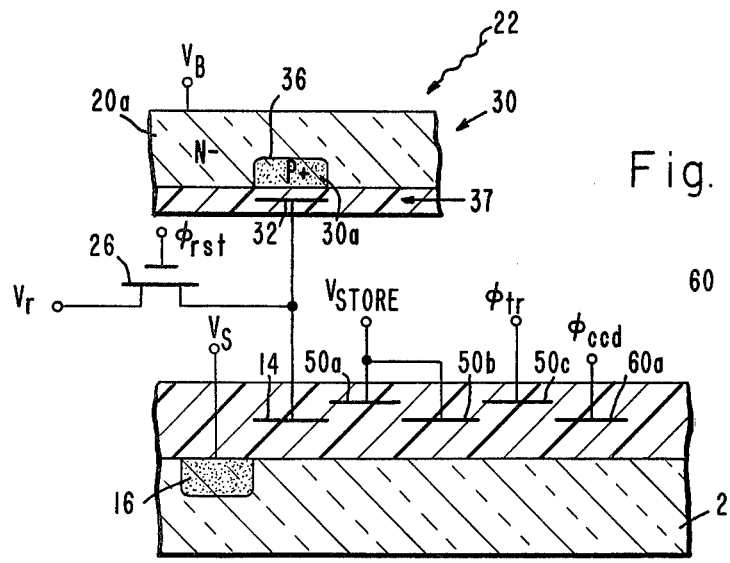
FIG. 2a is a simplified schematic diagram of the open circuit photodiode capacitor of the present invention illustrating its use with a CCD register.
Figure 4:
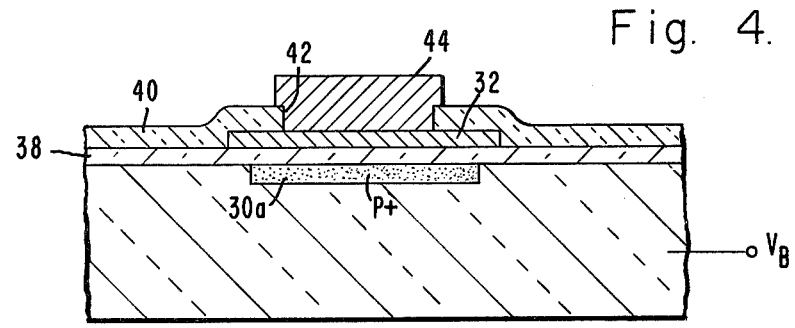
FIG. 4 is a cross-sectional view of the presently preferred embodiment open circuit photodiode capacitor of the present invention.

These problems are solved in the present invention, an open circuit photodiode capacitor illustrated in FIGS. 2a and 4. The invention includes an open circuit photodiode 30 comprising a semiconductive layer 20a of N-type conductivity, a diode diffusion 30a of P-type conductivity in the semiconductor layer 20 and an insulated capacitor plate 32 overlying the semiconductor layer 20 in registration with the diode diffusion 30a so as to form a photodiode capacitor 37. The diode diffusion 30a is not electrically connected so that the diode 30 is in an open circuit configuration. Radiation 22 incident upon the diode 30 generates current flow across diode junction 36 between the diffusion 30a and the remainder of the semiconductor layer 20. The current flow across the junction 36 charges the junction 36 and the capacitor 37 to an open circuit voltage which is proportional to the incident radiation flux. As soon as the capacitor 37 is so charged, current flow across the diode junction 36 ceases until the radiation flux again changes. If the radiation flux later changes to a new level, then the open circuit diode junction voltage changes so that current again flows across the junction 36 to charge (or discharge) the capacitor 37 to a new voltage corresponding to the new radiation flux level. As soon as the new capacitor voltage level is attained, current flow across the junction 36 again ceases. The direction of current flow across the junction 36 depends upon whether the charge on the capacitor 37 is increased or decreased, corresponding to an increase or decrease in radiation flux, respectively.

The voltage across the capacitor 37 follows the open circuit junction voltage of the diode 30 so that the capacitor 37 functions as a voltage source. Thus, there is no necessity for a resistive load device such as the MOSFET 12 of FIG. 1a across which a voltage drop must be created by a photocurrent. Instead, the diode capacitor plate 32 is connected directly to the CCD control gate 14 so that charge injected from the input diffusion 16 into the CCD register 18 under control of the gate 14 follows the junction voltage of the photodiode 30 in the manner of CCD gate modulation.

In order to filter out constant DC background radiation from the image signal, the voltage of the capacitor plate 32 is periodically reset, in synchronism with the clocking of the CCD register 18, to a constant reference voltage $V_r$ by means of a pulse clock signal $\phi_{rst}$ applied to a reset transistor 26 connecting the plate 32 to a reset voltage $V_r$. Thus, the voltage of the plate 32 equals the reference voltage $V_r$ plus any change $\Delta V_{oc}$ in the open circuit voltage $V_{oc}$ of the diode 30 occuring after the resetting step. Therefore, the voltage $V_g$ applied by the plate 32 to the CCD control gate 14 may be expressed as:

$$V_g = V_r + \Delta V_{oc}. \tag{1}$$

Referring to FIG. 3, the open circuit voltage $V_{oc}$ of the diode 30 is generated by electron-hole pairs created by photons incident on the semiconductive layer 20, and serves to forward bias the junction 36 so that, as the flux (photons per unit area per second) of incident radiation 22 varies between $R_1$ and $R_2$, the open circuit voltage of the photodiode 30 varies between the voltages $V_3$ and $V_4$ and is applied to the CCD control gate 14.

It is a significant discovery of this invention that the nonlinearity of the diode open circuit voltage $V_{oc}$ as a function of incident radiation flux R compensates for the nonlinearity in the output current $I_{ccd}$ of the CCD register 18 as a function of the voltage $V_g$ applied to the CCD control gate 14. While the prior art taught operating the photodiode in the reverse bias region (to the left of the vertical axis of FIG. 3) and providing a resistive load as a voltage source, the prior art did not solve the problem of nonlinearity of the output current $I_{ccd}$ of the CCD register 18 as a function of its control gate voltage $V_g$. The present invention does away with resistive load and operates in the forward bias region as an open circuit voltage source, with the result that the nonlinearity in the output current $I_{ccd}$ is compensated for by an opposing nonlinearity in the open circuit voltage $V_{oc}$ of the photodiode 30. Specifically, the output current $I_{ccd}$ of the CCD register 18 is an exponential function of the voltage $V_g$ applied to the CCD control gate 14, or:

$$I_{ccd} \propto \exp(V_g). \tag{2}$$

Substituting equation (1) into equation (2), the following is obtained for the circuit of FIG. 2a:

$$I_{ccd} \propto \mathrm{Exp}(V_r + \Delta V_{oc}). \tag{3}$$

The change $\Delta V_{oc}$ in the open circuit voltage of the photodiode 30 depends logarithmically upon the change $\Delta R$ in radiation flux R, or:

$$\Delta V_{oc} \propto \ln \Delta R. \tag{4}$$

Substituting equation (4) into equation (3), the following result is obtained for the circuit of FIG. 2a:

$$I_{ccd} \propto \Delta R. \tag{5}$$

Thus, in the circuit of FIG. 2a, the output current $I_{ccd}$ is a linear function of the radiation flux R because the logarithmic response of the diode open circuit voltage to radiation flux is superimposed upon the exponential response of the CCD output current to gate voltage.

The photodetector system illustrated in FIG. 2a may be a hybrid photodetector in which the photodector 30 and the charge coupled device 18 are formed in different semiconductive layers 20a, 20b, respectively. Alternatively, the photodetector system illustrated in FIG. 2a may be a monolithic photodetector in which the photodetector 30 and the charge coupled device 18 are formed on the same monolithic semiconductive substrate.

In the preferred embodiment illustrated in FIG. 4, the open circuit photodiode 30 is formed on a semiconductive substrate or layer 20 of N-type conductivity, and the P-type diode region 30a may be formed by ion implantation or diffusion. A dielectric layer 38 such as silicon dioxide is placed over the top surface of the substrate 20 and an aluminum-nickel capacitor plate 32 is placed over the dielectric layer in registration with the diode region 30a. A glass layer 40 is placed over the capacitor plate 32 and over exposed portions of the dielectric layer 38, the glass layer 40 having a contact opening 42 to the capacitor plate 32 in which an indium bump 44 is deposited as an electrode contact to the capacitor plate 32. A bias voltage $V_b$ is applied to the substrate 20 of FIG. 4 and is preferably selected so as to impose an electrical field which is equal and opposite to the electrical field created by surface charge $Q_{ss}$ at the surface of the substrate 20.

An advantage of the invention is that the reset voltage $V_r$ applied to the plate 32 may be selected so as to deplete charge carriers from beneath the capacitor plate 32 at the interface between the substrate 20 and the dielectric layer 38 near the P-N junction 36 to prevent leakage across the junction 36, thus eliminating the need for the prior art bias gate 10c illustrated in FIG. 1b. Thus, the invention not only compensates for the non-linearity in the output current $I_{ccd}$ but also increases the device density by eliminating the load MOSFET 12, the external coupling capacitor 24 and the bias gate 10c.

Figure 2B:
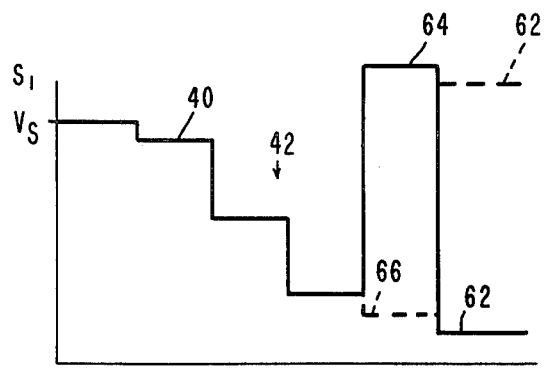

Implementation of CCD gate modulation charge injection using the open circuit photodiode 30 of the present invention is best understood by reference to FIG. 2b, illustrating the semiconductor surface potential S1 corresponding to FIG. 2a. A bias voltage $V_s$ applied to the P-type input diffusion 16 causes minority carriers to be injected over a potential barrier 40 beneath the control gate 14 into a potential well 42 beneath a pair of insulated store gates 50a, 50b (to which a constant voltage $V_{store}$ is applied). The amount of charge injected from the input diffusion 16 into the potential well 42 is determined by the height of the potential barrier 40, which in turn, is controlled by the voltage ($V_r + \Delta V_{oc}$) present at the capacitor plate 32 and the control electrode 14 during integration period. The charge accumulated in the potential well 42 is periodically transferred beneath a transfer gate 50c into a CCD serial register 60 in synchronism with the clock signal $\phi_{tr}$. The clock signal $\phi_{tr}$ is applied to the transfer gate 50c to periodically reduce the underlying surface potential from the barrier level 64 to a lower level 66 (indicated in dashed line), allowing the charge stored in the potential well 42 to pass beneath the transfer electrode 50c and enter the CCD register 60 beneath a CCD electrode 60a. Thus, a charge packet accumulated in the potential well 42 is periodically loaded into the CCD register 60 in synchronism with the clock signal $\phi_{tr}$, the size of each packet reflecting the voltage ($V_r + \Delta V_{oc}$) applied from the capacitor plate 32 to the control electrode 14. This generates a serial train of charge packets in the CCD register 60 forming a video signal representative of the change in radiation flux $\Delta R$ incident on the detector 30 during the integration period defined by the interval of the clock signal $\phi_{rst}$.

The operation of the imager of FIG. 2a will now be described in greater detail by simultaneous reference to FIGS. 2a, 2b, 8a, 8b and 9a–9f. For the sake of example only, it is assumed in this description that the image signal viewed by the imager of FIG. 2 is produced by a radiation source shielded by a beam chopper or other means producing the saw tooth time-domain waveform radiation flux $R_{image}$ illustrated in FIG. 8a. Furthermore, it is assumed that the background radiation flux level follows the step function time domain waveform illustrated in FIG. 8b. The image radiation flux $R_{image}$ of FIG. 8a and the background radiation flux $R_{dc}$ of FIG. 8b are superimposed upon one another in the plot of FIG. 9d having an expanded time scale corresponding to the short interval between times $T_a$ and $T_b$ of FIGS. 8a and 8b. The plot of FIG. 9d represents the total radiation flux incident upon the photodetector. As will be shown in this description, the invention virtually removes the effect of the step function waveform of the background radiation flux $R_{dc}$ from the photodetector output CCD current $I_{ccd}$.

Referring to FIGS. 9c and 9e, the clock signal $\phi_{rst}$ is turned on at time $T_1$ and periodically thereafter, causing the voltage $V_g$ of the CCD input gate 14 to be reset to the voltage source of $V_r$ through the reset MOSFET 26. (As a result, the voltage $V_g$ illustrated in FIG. 9e generally follows the saw tooth waveform of the radiation flux illustrated in FIG. 9d, but is periodically reset to the voltage $V_r$.) Subsequently, the clock signal $\phi_{rst}$ is turned off at time $T_2$ so that the potential of the CCD input gate 14 floats. Referring to FIG. 9d, the radiation flux R increases after time $T_2$ at a constant rate. Referring to FIG. 2a, the increase in radiation flux causes a corresponding increase in the population of hole-electron pairs at the P-N junction 36, the holes accumulating in the P-type diffusion 30a causing the potential of the P-type diffusion 30a to increase positively. As a result, the voltage $V_g$ (illustrated in FIG. 9e) of the capacitor plate 32 and of the CCD input gate 14 increases positively from the reset voltage $V_r$, raising the height of the potential barrier 40 in the substrate surface potential underlying the CCD input gate 14 and thereby decreasing the total amount of charge stored beneath the gates 14, 50a and 50b. A correspondingly reduced amount of charge $Q_{ccd}(T3)$ illustrated in FIG. 9f is stored in the potential well 42 at time $T_3$. From time $T_3$ to time $T_4$, the clock signal $\phi_{tr}$ turns on to lower the surface potential beneath the transfer gate 50c from the barrier position 64 to the well position 66, permitting the stored charge $Q_{ccd}(T3)$ to be injected from the store well 42 into the potential well 62 in the CCD register 60. Simultaneously, the clock signal $\phi_{rst}$ is turned on to reset potential of the CCD input gate 14 to the voltage $V_r$. When the clock signal $\phi_{tr}$ is turned off at time $T_4$, the surface potential beneath the transfer electrode 50c returns to the barrier position 64 to complete the transfer of charge into the CCD register 60. At time $T_5$ the clock signal $\phi_{ccd}$ turns off, thus raising the surface potential beneath the CCD gate 60a from the well position 62 to the barrier position 62' so that the injected charge $Q_{ccd}(T3)$ is transferred serially to the next adjacent CCD bucket in the CCD register 60. At time $T_6$ the clock signal $\phi_{ccd}$ is again turned on, creating the potential well 62 in preparation for receipt of the next charge packet from the store well 42. As illustrated in FIG. 9f, charge packets pass beneath the transfer gate 50c at times $T_7$, $T_9$ and $T_{11}$. The magnitude of the charge transferred at times $T_3$, $T_7$, $T_9$ and $T_{11}$ is proportional to the magnitude of the gate voltage $V_g$ illustrated in FIG. 9e at times $T_3$, $T_7$, $T_9$ and $T_{11}$ respectively. The output current $I_{ccd}$ of the CCD register 60 is illustrated in FIG. 9f in dashed line as a continuous curve following the discrete magnitude points of the transfer charge $Q_{ccd}$. The dashed line of FIG. 9f clearly shows that the output current $I_{ccd}$ is a nearly sawtooth waveform corresponding to the image waveform $R_{image}$ of FIG. 9d in which the effect of the step function waveform of the background radiation $R_{dc}$ is virtually eliminated. Thus, even though the radiation flux R increases suddenly at time $T_s$ of FIG. 9d due to the sudden increase in background radiation flux $R_{dc}$, no such increase appears in the output current $I_{ccd}$ illustrated in FIG. 9f.

Figure 5:
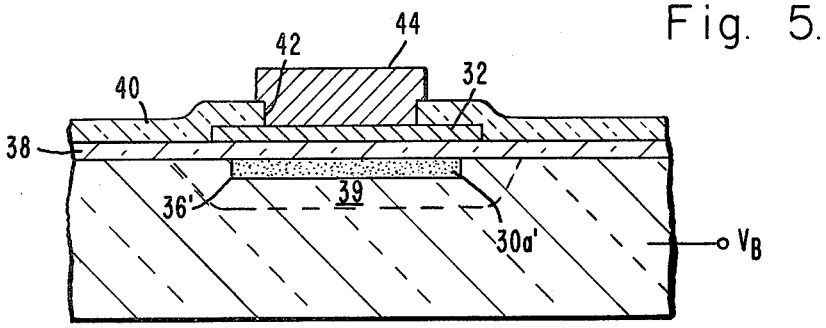
FIG. 5 is a cross-sectional view of an alternative embodiment of the open circuit photodiode capacitor of the present invention.

An alternative embodiment of the open circuit photodetector capacitor of the invention 30 is illustrated in FIG. 5 in which the diode diffusion 30a is eliminated. Instead, an inversion layer 30a' is formed (in place of the diffusion 30a) beneath the capacitor plate 32 by resetting the voltage of the capacitor plate 32 periodically to a voltage of sufficient magnitude and polarity to invert the underlying substrate surface to P-type conductivity in the region 30a'. Thus, the requirement for a bias gate 10c is eliminated because a depletion region 39 (in which little or no charge carriers reside) surrounds the inverted region 30a' by reason of the voltage applied to the capacitor plate 32. The depletion region 39 has little or no surface charge and therefore effectively prevents leakage across junction 36' surrounding the inversion layer 30a' at the interface between the substrate 20 and the dielectric layer 38.

Various materials may be chosen for fabrication so that, for example, the substrate 20 may be mercury-cadmium-telluride or indium antimonide, the dielectric layer 38 may be chemical vapor deposited zinc sulfide, while the over-glass layer 40 may be silicone dioxide.

Figure 2C:
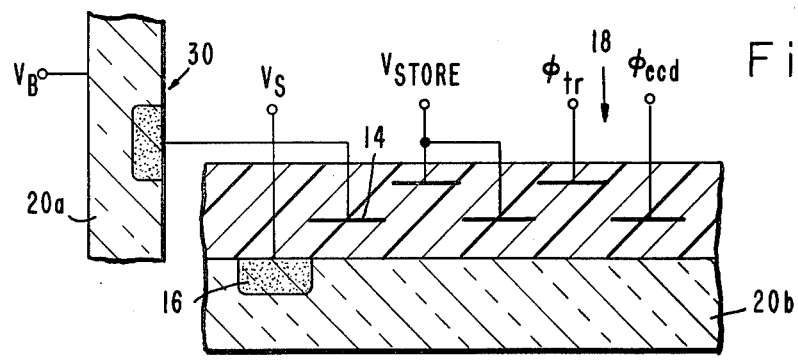
FIG. 2c is a schematic diagram of another aspect of the invention in which a forward biased diode is connected directly to the input gate of a CCD register.

In another aspect of the invention illustrated in FIG. 2c, the nonlinear response of the CCD serial output register 18 is compensated for in accordance with the discussion above given in connection with equations 1 through 6 by connecting a diode 10 directly to the CCD control gate 14. Although the circuit of FIG. 2c will not suppress background signal level, the relationship between the radiation flux R and the CCD output current $I_{ccd}$ is nevertheless inherently linear because the exponential response of the CCD output current to gate voltage is superimposed upon the logarithmic response of the diode open circuit voltage to incident radiation flux.

Open Circuit Direct Charge Injection Device

The novel structure of the open circuit diode capacitor 37 described above makes possible a novel open circuit direct injection device useful in charge coupled device imagers. This device is illustrated for the sake of simplified explanation as a bucket brigade device in FIG. 6 and includes an intervening bucket brigade direct injection channel 70 interposed between the open circuit photodiode capacitor 37 and a charge coupled device serial output register 72. The direct injection channel 70 includes a first transfer MOSFET 74, a MOS store capacitor 76 and an input MOSFET 78 connected to the capacitor plate 32 of the open circuit photodiode capacitor 37. Unlike the gate modulation technique utilized in the device of FIG. 2a, the direct injection device of FIG. 6 actually injects the charge stored on the open circuit photodiode capacitor 37 directly into the output CCD register 72. Specifically, a charge packet of a predetermined size $Q_{fz}$ is diverted from the CCD register 72 and stored on the capacitor plate 32 during an integration period. The charge packet is then retrieved from the open circuit photodiode capacitor plate 32 and reinjected into the CCD register 72. However, the size of the charge packet is "altered" during the integration period if the radiation flux incident upon the open circuit photodiode 30 has changed. The change in the size of the charge packet represents the video signal of the image viewed by the photodiode 30.

Figure 6:
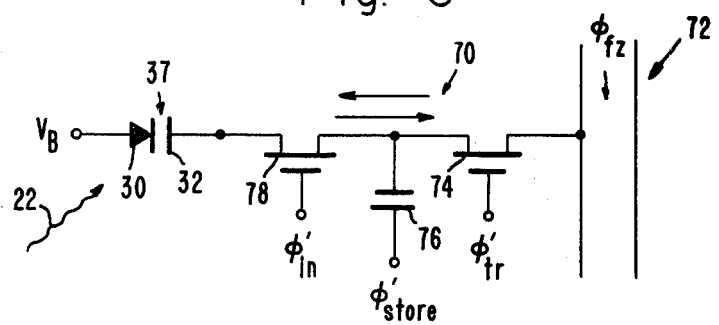
FIG. 6 is a simplified schematic diagram characterizing the operation of the AC coupled direct charge injection device of this invention.

Operation of the open circuit direct injection device of FIG. 6 begins when a charge packet of predetermined size, preferably of a size equal to the fat zero level $Q_{fz}$ of the CCD register 72, is transferred serially in the CCD register 72. When this charge packet is adjacent thhe transfer MOSFET 74, a clock signal $\phi'_{tr}$ turns on to apply an attractive voltage to the gate of the MOSFET 74 while a clock signal $\phi'_{store}$ turns on to apply an attractive voltage to the plate of the MOS capacitor 76 so that the charge packet is transferred out of the CCD register 72 beneath the gate 74a of the transfer MOSFET 74 and stored on the store capacitor 76. Subsequently, the clock signals $\phi'_{tr}$ and $\phi'_{store}$ turn off while the clock signal $\phi'_{in}$ applied to the gate of the input MOSFET 78 is on so that the charge packet is withdrawn from the capacitor 76 and flows through the input MOSFET 78 to be stored on the detector capacitor plate 32, after which the clock signal $\phi'_{in}$ turns off. During the subsequent integration period, if the flux R of radiation 22 incident on the open circuit photodiode 30 changes by an amount $\Delta R$, the open circuit voltage $V_{oc}$ on the capacitor plate 32 changes by a proportional amount $\Delta V_{oc}$, in accordance with the discussion given above in connection with FIG. 3. At the end of the integration period, the clock signals $\phi'_{in}$ and $\phi'_{store}$ turn on so that the charge packet is retrieved from the capacitor plate 32 to again be stored on the MOS capacitor 76, which after the clock signal $\phi'_{in}$ turns off. Because the open circuit voltage on the capacitor plate 32 has changed, the amount of charge released from the capacitor plate 32 to the store capacitor 76 is not equal to the original size $Q_{fz}$ of the charge packet previously withdrawn from the CCD register 72. It may be shown that the change $\Delta Q$ in the size of the charge packet from its original fat zero level $Q_{fz}$ is equal to the capacitance $C_{det}$ of the detector capacitor 37 multiplied by the change $\Delta V_{oc}$ in the open circuit voltage $V_{oc}$ of the photodiode 30, which may be expressed as follows:

$$\Delta Q = \Delta V_{oc} \times C_{det}.$$

It should be noted that $\Delta Q$ may be positive or negative, depending upon whether the radiation flux increased or decreased during the integration period.

The size Q of the charge packet stored on the store capacitor 76 at the end of the integration period is equal to the fat zero level $Q_{fz}$ of the CCD register 72 plus $\Delta Q$ which may be expressed as follows:

$$Q = Q_{fz} + \Delta Q$$

Subsequently, the charge packet stored on the store capacitor 76 is reinjected into the CCD register 72 when the clock signal $\phi'_{store}$ turns off while the clock signal $\phi'_{tr}$ turns on so that the charge packet is withdrawn from the store capacitor 76 and passes beneath the transfer gate 74a and into the CCD register 72. Thus, a serial train of charge packets may be generated in the output register 72 forming a video signal represented by the difference $\Delta Q$ between the size of each charge packet and the fat zero level $Q_{fz}$.

Figure 7A:
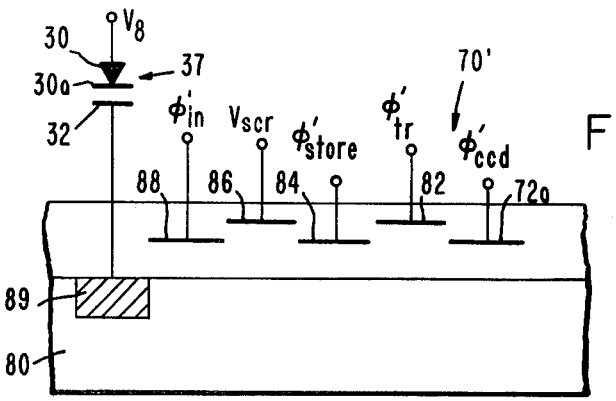
FIG. 7a is a simplified schematic diagram of the preferred embodiment AC coupled direct charge injection device of the invention.

The preferred embodiment of the invention is illustrated in FIG. 7a in which the open circuit photodiode capacitor 37 controls the direct injection of charge packets transferred serially in the CCD output register 72 by means of an intervening CCD channel 70' formed with the output CCD register 72 on an N-type semiconductive layer 80 including a CCD electrode 72a connected to receive the clock signal $\phi'_{ccd}$. The intervening CCD channel 70' includes a transfer gate 82 connected to receive the clock signal $\phi'_{tr}$, a store gate 84 connected to receive the clock signal $\phi'_{store}$, a screen gate 86 connected to a voltage source $V_{scr}$ and an input gate 88 connected to receive the clock signal $\phi'_{in}$. A P-type diffusion 89 adjacent the input gate 88 is connected to the capacitor plate 32 to permit charge transfer between the capacitor plate 32 and the intermediate CCD channel 70'. It will be easily recognized by those skilled in the art that the intervening CCD channel 70' of FIG. 7a is equivalent to the bucket brigade device 70 of FIG. 6.

Operation of the charge coupled direct injection device of FIG. 7a will now be described in detail by simultaneous reference to FIGS. 7a, 7b, 10a–10e and 11a–11c. FIGS. 10a through 10e are plotted on a time scale expanded from that of FIG. 11a and correspond to the time window between $T_0$ and $T_p$ of FIG. 11a. For the sake of simplified explanation only, in this description it will be assumed that the total incident radiation flux follows the waveform illustrated in FIG. 11a, in which the sawtooth waveform of the image radiation flux $R_{image}$ illustrated in FIG. 8a is superimposed upon the step function waveform of the background radiation flux $R_{dc}$ is illustrated in FIG. 8b as in the previous example discussed above in connection with FIG. 2a. It will be seen that the effects of the background radiation flux $R_{dc}$ are virtually eliminated in the CCD output current $I_{ccd}$ in the device of FIG. 7a.

Figure 7B:
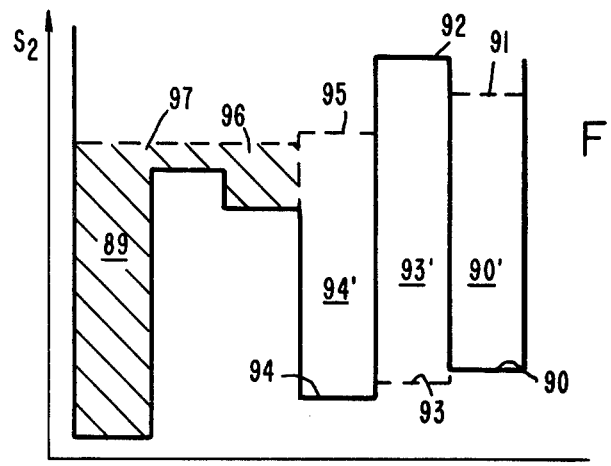
Figure 10A:
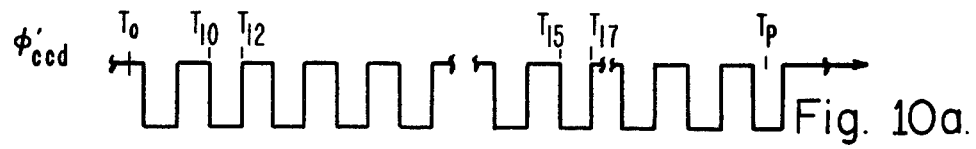
Figure 10B:
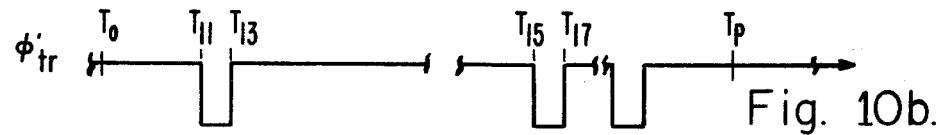
FIG. 10b is a diagram of the time domain waveform of the clock signal $\phi'_{tr}$.
Figure 10C:
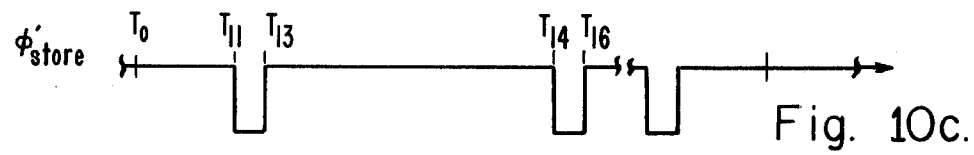
FIG. 10c is a diagram of the time domain waveform of the clock signal $\phi'_{store}$.

Referring to FIG. 10a, operation begins at time $T_{10}$ when the clock signal $\phi'_{ccd}$ turns on, causing the surface potential $S_2$ of the substrate 80 illustrated in FIG. 7b to fall from the barrier level 91 underlying the CCD electrode 72a to the well level 90, which permits a fat zero charge packet $Q_{fz}$ to be transferred and held beneath the CCD electrode 72a. At time $T_{11}$, the clock signals $\phi'_{tr}$ and $\phi'_{store}$ illustrated in FIGS. 10b and 10c respectively, turn on, causing the surface potential $S_2$ to decrease from the barrier levels 92 and 95 underlying the transfer gate 82 and the store gate 84 respectively, to the well levels 93 and 94 respectively. Subsequently, at $T_{12}$ to the clock signal $\phi'_{ccd}$ turns off, transferring the fat zero charge packet $Q_{fz}$ into the potential wells 93' and 94'. Subsequently, at time $T_{13}$ the clock signals $\phi'_{tr}$ and $\phi'_{store}$ turn off, causing the surface potential $S_2$ to return to the barrier levels 92 and 95 so that the fat zero charge packet $Q_{fz}$ is transferred into a region including the diffusion 89 and potential wells 96 and 97 underlying the electrodes 86 and 88 respectively. Therefore, as soon as the clock signals $\phi'_{tr}$ and $\phi'_{store}$ turn off at time $T_{13}$, the amount of charge $Q_I$ stored in the region 89, 96, 97 immediately increases from an initial level $Q_0$ to a new level $Q_{fz}+Q_0$ as illustrated in FIG. 10e. The decreasing radiation flux R illustrated in FIG. 10d causes the open circuit voltage $V_{oc}$ of the photodiode 30 to decrease, reducing the positive charge stored in the P-type diffusion 30a of the open circuit photodiode 30, causing a corresponding decrease in the negative charge (electrons) stored on the capacitor plate 32. The negative charge (electrons) leaving the capacitor plate 32 flows to the CCD diffusion 89 and combines with holes in the CCD diffusion 89, causing a corresponding decrease in the amount of positive charge $Q_i$ stored in the region 89, 96, 97. Accordingly, FIG. 10e illustrates that, beginning at time $T_{13}$, the stored charge $Q_i$ decreases in proportion to the decrease in radiation flux R illustrated in FIG. 10d. At time $T_{14}$ the stored charge $Q_i$ is removed from the region 89, 96, 97 when the clock signal $\phi'_{store}$ turns on to decrease the surface potential $S_2$ from the barrier level 95 to the well level 94 so that the stored charge $Q_i$ is withdrawn from the region 89, 96, 97 and held beneath the store gate 84. Subsequently, at time $T_{15}$ the clock signals $\phi'_{ccd}$ and $\phi'_{tr}$ turn on to decrease the surface potential $S_2$ from the barrier levels 92, 91 respectively to the potential well levels 93, 90 respectively. Thereafter at time $T_{16}$ the clock signal $\phi'_{store}$ turns off, causing the surface potential $S_2$ to increase from the potential well level 94 to the barrier level 95 while at time $T_{17}$ the clock signal $\phi'_{tr}$ is turned off to cause the surface potential $S_2$ to increase from the potential well level 93 to the barrier level 92, thus causing the stored charge $Q_i$ to be injected into the potential well 90' beneath the CCD gate 72a. The amount of charge $Q_{ccd}$ injected into the CCD output register 72 at time $T_{17}$ is indicated in dashed line in FIG. 10e and is equal to the charge $Q_i$ previously stored in the region 89, 96, 97 at time $T_{14}$.

Figure 10D:
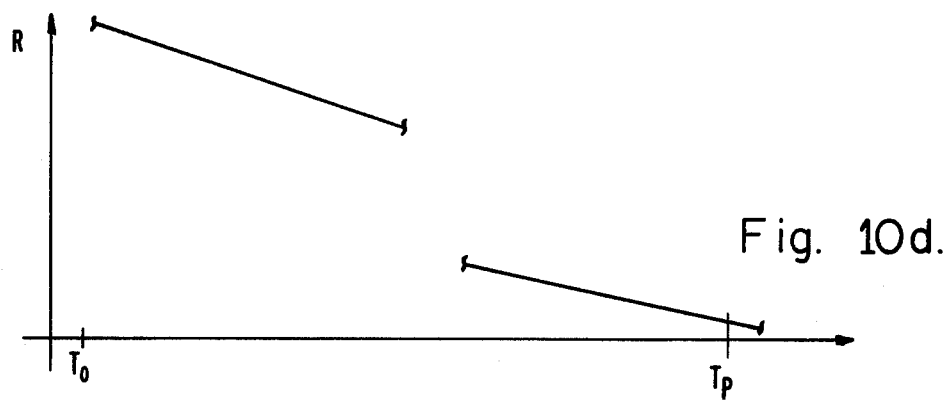
Figure 10E:
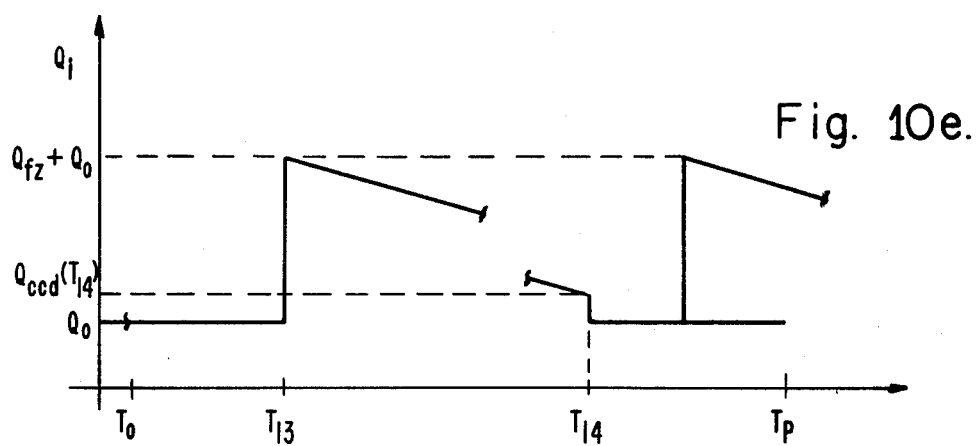
FIG. 10e is a diagram of the time domain waveform of the charge $Q_i$ stored in the device of FIG. 7a corresponding to FIG. 10d.
Figure 11A:
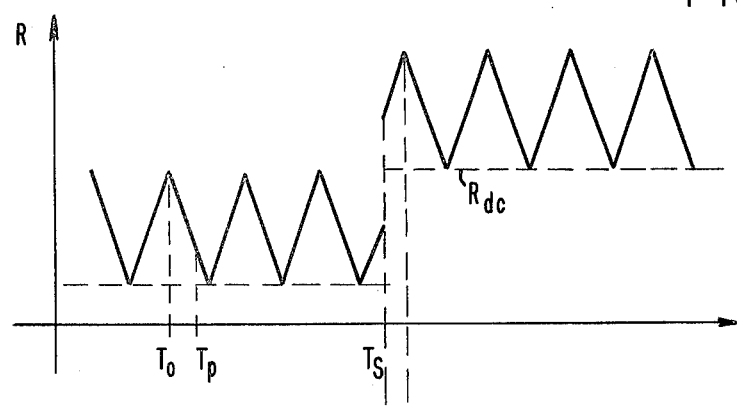
FIG. 11a is a diagram of the time domain waveform of the radiation flux $R_{image}+R_{dc}$ corresponding to FIG. 10d.
Figure 11B:
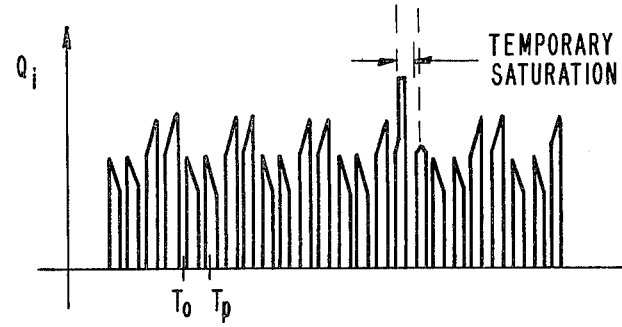
FIG. 11b is a diagram of the time domain waveform of the stored charge $Q_i$.
Figure 11C:
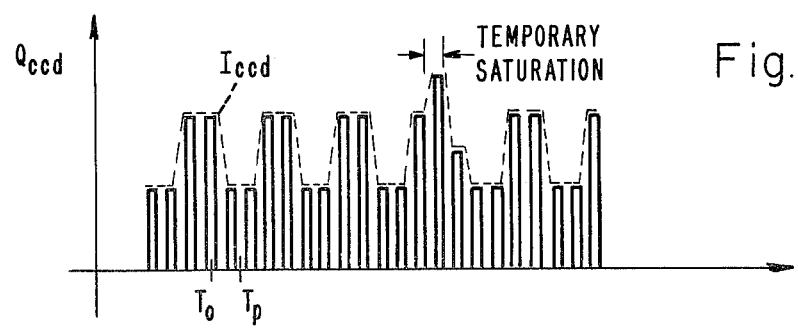

Comparing FIGS. 10e and 10d, it is apparent that the stored charge $Q_i$ follows the radiation flux R of FIG. 10d but is periodically reset in synchronism with the clock signal $\phi'_{store}$ to an initial level $Q_0$. This is best illustrated in FIG. 11b which clearly shows that the stored charge $Q_i$ increases during those periods corresponding to the positive slope of the radiation flux sawtooth waveform of FIG. 11a and decreases during those periods corresponding to the negative slope of the sawtooth waveform of FIG. 11a. The output charge $Q_{ccd}$ injected into the CCD register 72 at the end of each integration period is illustrated in FIG. 11c corresponding to the time scale of FIGS. 11a and 11b, clearly showing that the output charge $Q_{ccd}$ injected at the end of each integration period into the output register 72 is precisely equal to the stored charge $Q_i$ at the end of each integration period. The waveform of the CCD output current $I_{ccd}$ is approximated in FIG. 11c by the dashed line following the peak values of the output charge $Q_{ccd}$ of FIG. 11c. The dashed line of FIG. 11c clearly shows that the output current $I_{ccd}$ roughly follows the sawtooth waveform of FIG. 11a of the image radiation flux $R_{image}$. The effect of the background radiation flux step function waveform $R_{dc}$ is virtually removed from the waveform of the output current $I_{ccd}$ with a minor exception that the device is temporarily saturated at time $T_s$ of FIGS. 11a–c when the background radiation flux $R_{dc}$ suddenly increases in accordance with its step function waveform as illustrated in FIG. 11a. The temporary saturation of the output device is limited to the single integration period begining at time $T_s$, and FIG. 11c clearly shows that the output current $I_{ccd}$ resumes its usually nearly sawtooth waveform shortly after time $T_s$. As a result, the output current $I_{ccd}$ is a reliable representation of the image radiation flux $R_{image}$ and is virtually independent of the background radiation flux $R_{dc}$. Truncation of the sawtooth waveform in FIG. 11c occurs in this tutorial example only because the center frequency of the input signal $R_{image}$ of FIG. 11a is close to the sampling frequency defined by the clock signal $\phi'_{store}$ of FIG. 10c. It should be understood that a skilled worker may select a sufficiently high frequency for each clock signal illustrated in FIGS. 10a, 10b and 10c so that the sampling frequency of the device of FIG. 7a is significantly greater than the frequency of the image viewed by the device.

An output video signal may be derived from a plurality of intervening CCD channels 70' and open circuit photodiode capacitors 37 in a planar array (not shown) comprising a plurality of such photodiode capacitors. A significant advantage of the open circuit direct injection device of FIGS. 6 and 7a is that the video signal (represented by the charge difference $\Delta Q$) is virtually insensitive to background radiation having a constant flux.

What is claimed is:

1. A charge transfer device imager comprising:
   a photosensitive semiconductor diode comprising first and second regions of opposite conductivity types disposed to receive an incident flux of radiation, at least one of said regions being unconnected so that said diode has an open circuit junction voltage in the presence of radiation proportional to said radiation flux;
   a capacitive electrode overlying said one unconnected region;
   a charge transfer device comprising a charge flow channel formed in semiconductive material;
   a charge storing region in said semiconductive material adjacent said charge transfer device and connected to said capacitive electrode;
   means for removing a charge packet from the charge flow channel and storing it in said charge storing region to begin an integration period; and
   means for retrieving at least a portion of said charge packet from said charge storing region to terminate said integration period and for returning said portion to said charge flow channel, wherein the difference between the charge removed from the charge flow channel and the charge returned to the charge flow channel by said removing and returning means is proportional to the change in said radiation flux during said integration period.

2. A charge transfer device imager comprising:
   a semiconductor diode comprising two regions of opposite conductivity types disposed to receive an incident radiation flux of photons which create electron-hole pairs in said diode, at least one of said regions being electrically isolated and containing an amount of charge accumulated from at least some of said electron-hole pairs, said amount being proportional to said radiation flux;
   means overlying said one isolated region in the manner of a capacitive electrode for storing a quantity of charge which is proportional to said amount of charge contained in said one isolated region;
   a charge transfer device comprising a charge flow channel formed in semiconductive material;
   a charge storing region in said semiconductor material adjacent said charge flow channel;
   means for removing a charge packet from the charge flow channel and storing it in said adjacent storage region to begin an integration period;
   means for retrieving at least a portion of said charge packet from said adjacent charge storing region to terminate said integration period and for returning it to said charge flow channel; and
   means permitting current flow between said adjacent charge storing region and said capacitive electrode means to accommodate changes in the quantity of charge stored in said adjacent charge storing region in response to changes in said radiation flux during said integration period.

3. The device of claim 2 wherein said means for permitting current flow comprise a diffused region in said charge storing region and a conductor connected between said diffused region and said capacitor plate.

4. The charge transfer device imager of claim 1 or 2 wherein said diode is forward biased so that when said diode is fully charged, virtually no current flows between said opposite conductivity type regions of said diode in the absence of changes in said radiation flux.

5. The device of claim 1 or 2 wherein said charge transfer device is formed in a semiconductive substrate and said diode regions of opposite conductivity types are formed in a semiconductive layer overlying said semiconductive substrate.

* * * * *